US006949933B2

(12) United States Patent
Weaver

(10) Patent No.: US 6,949,933 B2
(45) Date of Patent: Sep. 27, 2005

(54) APPARATUS AND METHOD FOR MONITORING ELECTRICAL CABLE CHAFING VIA OPTICAL WAVEGUIDES

(75) Inventor: Thomas L. Weaver, Webster Groves, MO (US)

(73) Assignee: The Boeing Company, Chicago, IL (US)

( * ) Notice: Subject to any disclaimer, the term of this patent is extended or adjusted under 35 U.S.C. 154(b) by 49 days.

(21) Appl. No.: 10/786,218

(22) Filed: Feb. 25, 2004

(65) Prior Publication Data

US 2005/0184738 A1    Aug. 25, 2005

(51) Int. Cl.[7] .......................... G01R 31/02; G02B 6/44; G02B 6/00; G01N 21/00
(52) U.S. Cl. ...................... 324/541; 324/544; 385/101; 385/13; 356/73.1
(58) Field of Search ............................. 324/541, 544, 324/539, 543, 538; 356/73.1, 32, 35.5; 250/227.12, 250/227.13, 227.14, 227.18; 385/101, 102, 385/71, 12, 13

(56) References Cited

U.S. PATENT DOCUMENTS

| 4,298,794 | A | * | 11/1981 | Snitzer et al. | .......... 250/227.14 |
| 4,432,599 | A | * | 2/1984 | McMahon | ............. 250/227.14 |
| 5,155,439 | A | * | 10/1992 | Holmbo et al. | .............. 324/534 |
| 5,178,465 | A | * | 1/1993 | Amano et al. | ............... 374/131 |
| 6,265,880 | B1 | * | 7/2001 | Born et al. | ................. 324/541 |
| 6,591,025 | B1 | * | 7/2003 | Siems et al. | ................... 385/12 |

* cited by examiner

*Primary Examiner*—Anjan Deb
(74) *Attorney, Agent, or Firm*—Thompson Coburn LLP

(57) ABSTRACT

A method and apparatus for using optical waveguides to detect chafing of electrical cables. Chafing damage is preferably detected by disposing several optical waveguides about the periphery of an electrical cable such that any chafing that causes damage to the electrical cable will likely also cause damage to at least one of the optical waveguides. The disclosed apparatus and method allows multiple optical waveguides of one cable segment to be connected to multiple optical waveguides of an adjacent cable segment using only a single optical waveguide connection, while still allowing each of the optical waveguides of either cable segment to be monitored independently of each other.

20 Claims, 2 Drawing Sheets

APPARATUS AND METHOD FOR MONITORING ELECTRICAL CABLE CHAFING VIA OPTICAL WAVEGUIDES

BACKGROUND OF THE INVENTION (1) Field of the Invention

This invention pertains to the use of optical waveguides in detecting chafing of electrical cables. In particular, this invention pertains to apparatus and methods for reducing the size and/or number of optical connectors utilized in connection with optical chafe-detection devices, without sacrificing the performance or reliability of such devices.

(2) Background

Electrical cables that are subjected to vibrations or other movements are often susceptible to chafing damage. Such chafing damage can expose or sever the electrical wires of such cables, resulting in electrical shorts, arcing, and loss of functionality. When such damage is caused to critical electrical cables, such as those utilized in flight control systems of aircraft, catastrophic consequences, including loss of aircraft and life, can result.

As should be appreciated, identifying the existence of chafing damage before such damage has a serious impact is desirable. Additionally, because such cables are often concealed behind panels or other systems and structure, it is also desirable to identify the approximate location of chafing damage along electrical cables without visually inspecting such cables.

SUMMARY OF THE INVENTION

The present invention makes it practical to utilize optical waveguides to detect chafing of electrical cables. In general, optical waveguides, such as fiber optic strands or fiber optic ribbon, can be utilized to detect chafing of an electrical cable by disposing one or more of such optical waveguides about the periphery of an electrical cable such that any chafing that causes damage to the electrical cable will likely also cause damage to at least one of the optical waveguides. By monitoring such optical waveguides for damage using known techniques, such as optical time domain reflectivity, the existence and location of any such damage can easily be detected, without the need to visually inspect the electrical cable.

For reliability and other purposes, it is preferable to utilize a plurality of optical waveguides that each extend longitudinally parallel to the longitudinal trajectory of the electrical cable being monitored. Additionally, it is preferable to be able to monitor each of such optical waveguides separately. However, an electrical cable may comprise several electrical cable segments that, although attached to each other in series, must remain releasably detachable from each other using connectors. Preferably, each of the waveguides attached to such electrical cables must also comprises segments or sets of waveguides that can be selectively detached and reattached to each other to allow for separation of one electrical cable segment from another. In general, this would suggest the need for additional connectors for each of the optical waveguides or the need for large connectors having multiple optical terminus pins or receptors.

Unfortunately, the use of large or numerous optical waveguide connectors in connection with optical chafe-detection devices may render such devices impractical in various situations. Notably, the installation and removal of and electrical cable from an object becomes more difficult as the size and number of connectors that must be fed along the routing path of the cable increases. Additionally, as the number of connectors required to remove or install an electrical cable increases, so too does the complexity of making the proper connections and time required for the task.

However, utilizing the present invention, multiple optical waveguides associated with one electrical cable segment can be operatively connected to multiple optical waveguides associated with another adjacent electrical cable segment via just one single-pin connector assembly. Thus, the present invention greatly simplifies the configuration and practicality of optical chafe-detection devices.

In a first embodiment of the invention, an assembly comprises an electrical cable, a plurality of optical waveguides, first and second optical waveguide connectors, and first and second wavelength division multiplexing multiplexers/demultiplexers. The electrical cable comprises at least one electrically conductive wire and the optical waveguides are disposed peripherally about the electrical cable in a manner to detect chafing of the electrical cable. The first wavelength division multiplexing multiplexer/demultiplexer operatively connects each of the plurality of optical waveguides to the first optical waveguide connector. Similarly, the second wavelength division multiplexing multiplexer/demultiplexer operatively connects each of the plurality of optical waveguides to the second optical waveguide connector.

In a second embodiment of the invention, an assembly comprises an electrical cable, a sheath, an optical waveguide connector, and a wavelength division multiplexing multiplexer/demultiplexer. The electrical cable comprises at least one electrically conductive wire. The sheath encircles the electrically conductive wire and comprises a plurality of optical waveguides disposed peripherally about the electrical cable in a manner to detect chafing of the electrical cable. The wavelength division multiplexing multiplexer/demultiplexer operatively connects each of the plurality of optical waveguides to the optical waveguide connector.

In a third embodiment of the invention, a method comprises a step of providing first and second cables. Each of the first and second cables comprises at least one electrically conductive wire and a plurality of optical waveguides. The method further comprises a step of providing an intermediate optical waveguide and a step of operatively connecting each of the plurality of optical waveguides of the first cable and each of the plurality of optical waveguides of the second cable to the intermediate waveguide. Additionally, the method comprises a step of transmitting a plurality of separate wavelength channels of light along the plurality of optical waveguides of the first cable. The transmitting occurs in a manner such that each of the separate wavelength channels of light is transmitted along a separate one of the optical waveguides of the first cable. Furthermore, the method comprises routing each of the separate wavelength channels of light transmitted along the plurality of optical waveguides of the first cable into the intermediate optical waveguide. Yet further, the method comprises routing each of the separate wavelength channels of light from the intermediate optical waveguide in a manner such that each of the separate wavelength channels of light is transmitted along a separate one of the optical waveguides of the second cable. Finally, the above-recited steps are utilized to monitor the second cable for chafing damage.

While the principal advantages and features of the invention have been described above, a more complete and thorough understanding of the invention may be obtained by referring to the drawings and the detailed description of the preferred embodiments, which follow.

Figure 1:
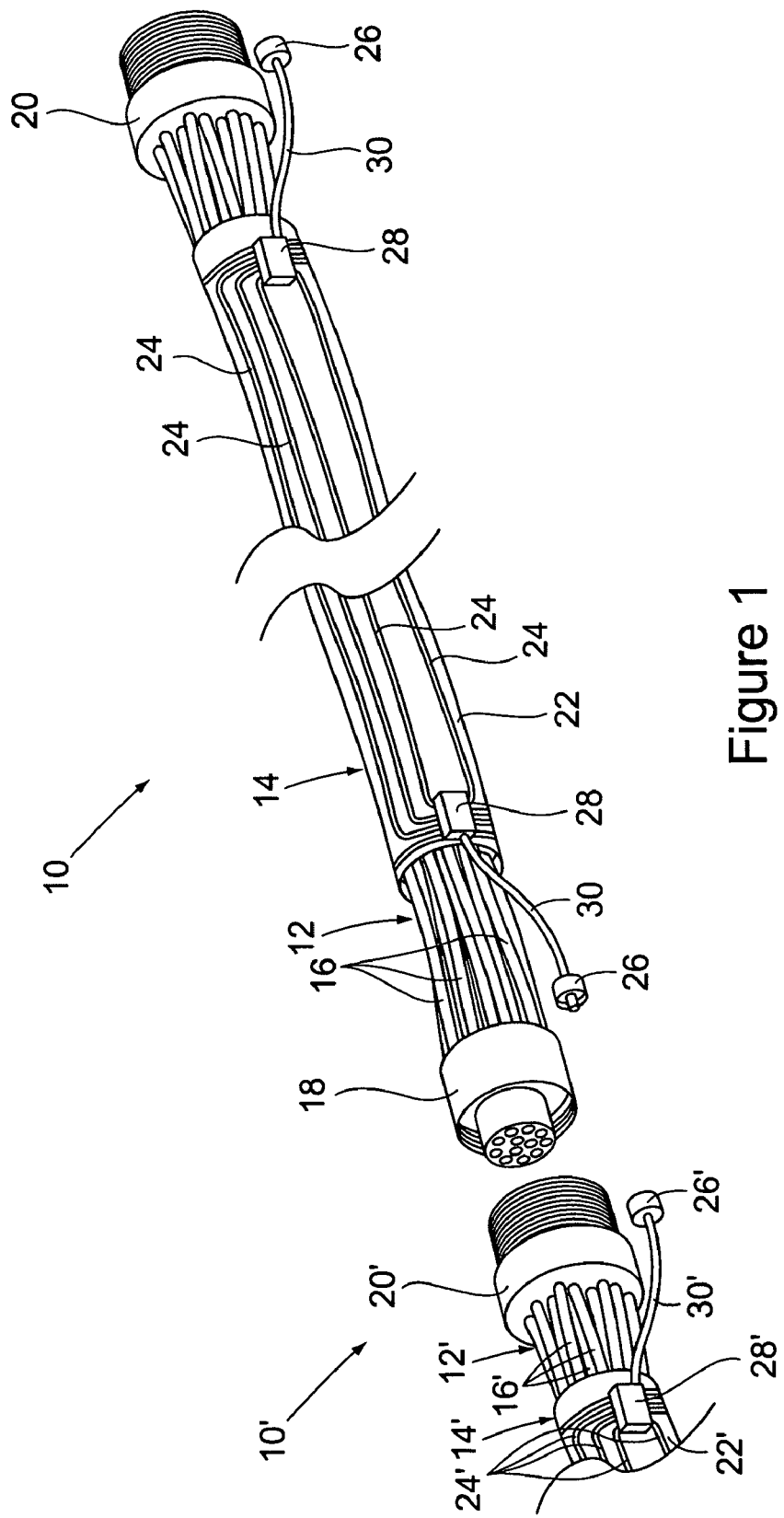
FIG. 1 is broken perspective view of a first preferred embodiment of an apparatus in accordance with the invention.

Reference characters in the written specification indicate corresponding items shown throughout the drawing figures.

DETAILED DESCRIPTION OF THE PREFERRED EMBODIMENTS OF THE INVENTION

A first preferred embodiment of an apparatus in accordance with the invention is shown in FIG. 1. Referring to FIG. 1, in this embodiment, a cable 10 preferably comprises an electrical cable segment 12, and a sheath 14.

The electrical cable 12 could be merely a single electrically conductive wire of any type and form. However, for purposes of describing the invention, the electrical cable 12 is presumed to comprise a plurality of electrically conductive wires 16 that each extend longitudinally along a trajectory path from a female electrical connector 18 to a male electrical connector 20. The electrical connectors 18, 20 are preferably standard electrical connector fittings and need not necessarily be a matching pair of connectors. In other words, the electrical connectors 18, 20 could be sized differently to attach to particular connectors but not to each other, and could both be male or female.

The sheath 14 preferably comprises a tubular member 22, a plurality of optical waveguides 24, a pair of optical waveguide connectors 26, and a pair of wavelength division multiplexing multiplexers/demultiplexers 28. The tubular member 22 of the sheath 14 is preferably formed of a flexible sheet material such a fabric, aramid fiber, plastic, rubber, or other relatively thin and flexible material. The tubular member 22 is also preferably configured to encircle the electrical cable 12 in a snug manner and to extend substantially the same length as electrical cable, terminating just slightly short of the electrical connectors 18,20 so as not to interfere therewith. The tubular member 22 may be formed of a rectangular shaped portion of sheet material that has been wrapped around the electrical cable 12 and secured to itself by any fastening means. Alternatively, the tubular member 22 could also be formed as a tube and slid over one of the electrical connectors 18,20 until longitudinally in place.

The optical waveguides 24 of the sheath 14 are preferably formed of commonly available optical ribbon or fiber optic strands. Each of the optical waveguides 24 is preferably attached to the tubular member 22 in a manner such that the optical waveguides extend longitudinally along trajectories that are generally parallel to the longitudinal trajectory of the electrical cable 12. Preferably, eight such optical waveguides 24 are provided on the tubular member 22 of the sheath 14. Additionally, the optical waveguides 24 are also preferably attached to the tubular member 22 in a manner such that the optical waveguides are disposed about the periphery of the electrical cable 12 in an evenly spaced manner.

The wavelength division multiplexing multiplexers/demultiplexers 28 (WDM(s)) are preferable attached to the sheath 14 at or near the opposite longitudinal ends of the sheath. As shown, the opposite longitudinal ends of the optical waveguides 24 preferably terminate at the WDMs 28 and are operatively connected thereto. As is also shown, an intermediate optical waveguides portion 30 preferably operatively connects each of the WDMs 28 to the optical waveguide connector 26 adjacent thereto.

FIG. 1 also depicts one end of a second cable segment 10' that is configured to be connected to the first cable segment 10 discussed above. For purposes of explaining the invention, the second cable segment 10' is presumed to be similar to the first 10, albeit perhaps having a substantially different length. As such, the labeled reference numbers of the second cable 10' generally correspond to the same such numbers of the first cable 10, with the prime symbol distinguishing those components of the second cable from those of the first cable.

The preferred method of utilizing the optical chafe-detection device shown in FIG. 1 comprises attaching the first and second cables 10,10' to each other in series. This is preferably done by releasably connecting the male electrical connector 20' of the second cable segment 10' to the female electrical connector 18 of the first cable segment 10, and by releasably connecting the appropriate optical waveguide connector 26 of the first cable to the appropriate optical waveguide connector 26' of the second cable 10'. Although not shown, it should be appreciated the many other cable segments may be joined in this manner in series with the first and second cable segments 10,10' and that ultimately, the circuit terminates at one or more electrical devices, possible branching apart in the process. It should also be appreciated that at least one of optical waveguide connectors 26 is ultimately connected or connectable to a light source and/or a light pulse measuring device such as an optical time domain reflectometer (OTDR).

As assembled as described above, the wavelength division multiplexing multiplexers/demultiplexers 28 of the cable 10 are configured to route or channel a plurality of wavelength channels of light through the intermediate optical waveguide portions 30 and to route such plurality of wavelength channels of light separately through the plurality of optical waveguides 24. In other words, each optical waveguide 24 of the sheath 14 acts as a conduit for a particular wavelength channel of light that is distinguishable from the other wavelength channels of light associated with the other optical waveguides of the sheath. Additionally, the intermediate optical waveguide portions 30 act as conduits for all such wavelength channels of light.

In view of the foregoing, it should be appreciated that, the optical waveguides 24 of the cable segment 10 are operatively connected to the optical waveguides 24' of the adjacent cable segment 10' in a one-to-one relationship. However, it should also be appreciated that the WDMs 28, 28' allow all such connections to be made merely by connecting the two respective intermediate optical waveguide portions 30,30' via the optical waveguide connectors 26,26' at the terminal ends of such intermediate optical waveguide portions. The operative result is the same as would result had each of the optical waveguides 24 of the cable 10 been connected to the optical waveguides 24' of the adjacent cable 10' independently of each other in a one-to-one relationship. However, only one connection is needed for all the optical waveguides 24,24', rather than a separate connection for each of the optical waveguides. This greatly reduces the size of the coupling between the cables 10,10' and the complexity of coupling and uncoupling such cables when desired.

In operation, one or more OTDR(s) can be utilized to monitor the condition of each of the optical waveguides 24,24' of a series of cables 10,10' by monitoring the time domain reflection of light pulses transmitted along such optical waveguides. For example, a multi-wavelength channel pulse or a series of different wavelength channel pulses can be transmitted into one end of the first cable segment 10 via the intermediate waveguide portion 30 at such end of the cable. Upon reaching the WDM 28 attached to such intermediate waveguide portion 30, the WDM routes each wavelength channel of light into a different one of the optical waveguides 24. When such wavelength channels of light reach the opposite WDM 28, that WDM routes all of such wavelength channels of light through the intermediate waveguide portion 30 attached thereto. The light pulse or pulses then travel into and through the adjacent cable 10' in a similar manner via the couple between the optical waveguide connectors 26,26'.

When the light pulses pass along the cables 10,10' and encounter couplings or damaged portions of the optical waveguides 24, portions of the light pulses are reflected back in the opposite direction, and ultimately to an OTDR that measures the time domain pattern of such reflections. As is well know in the field of fiber optics, by comparing changes in these time domain patterns from one measurement to the next, the presence of any new damage to an optical waveguide can easily be detected. Moreover, as is also well know in the industry, the location of any such damaged portion along the optical conduit can also be approximated from such measurements. Thus damage can be identified and located without visual inspection of the optical waveguides.

It should be appreciated that, by disposing the optical waveguides peripherally about the electrical cable portion of the cable assembly, any damage to the cable assembly resulting from chafing or ballistics will likely cause damage to one or more of the optical waveguides. In the case of chafing damage, the optical waveguides will likely be damaged prior to any damage being caused to the electrical cable. Thus, the monitoring method of the present invention allows for the early detection of such damage, before such damage becomes a serious danger. As such, technicians can then take the necessary steps to prevent further damage from occurring.

Figure 2:
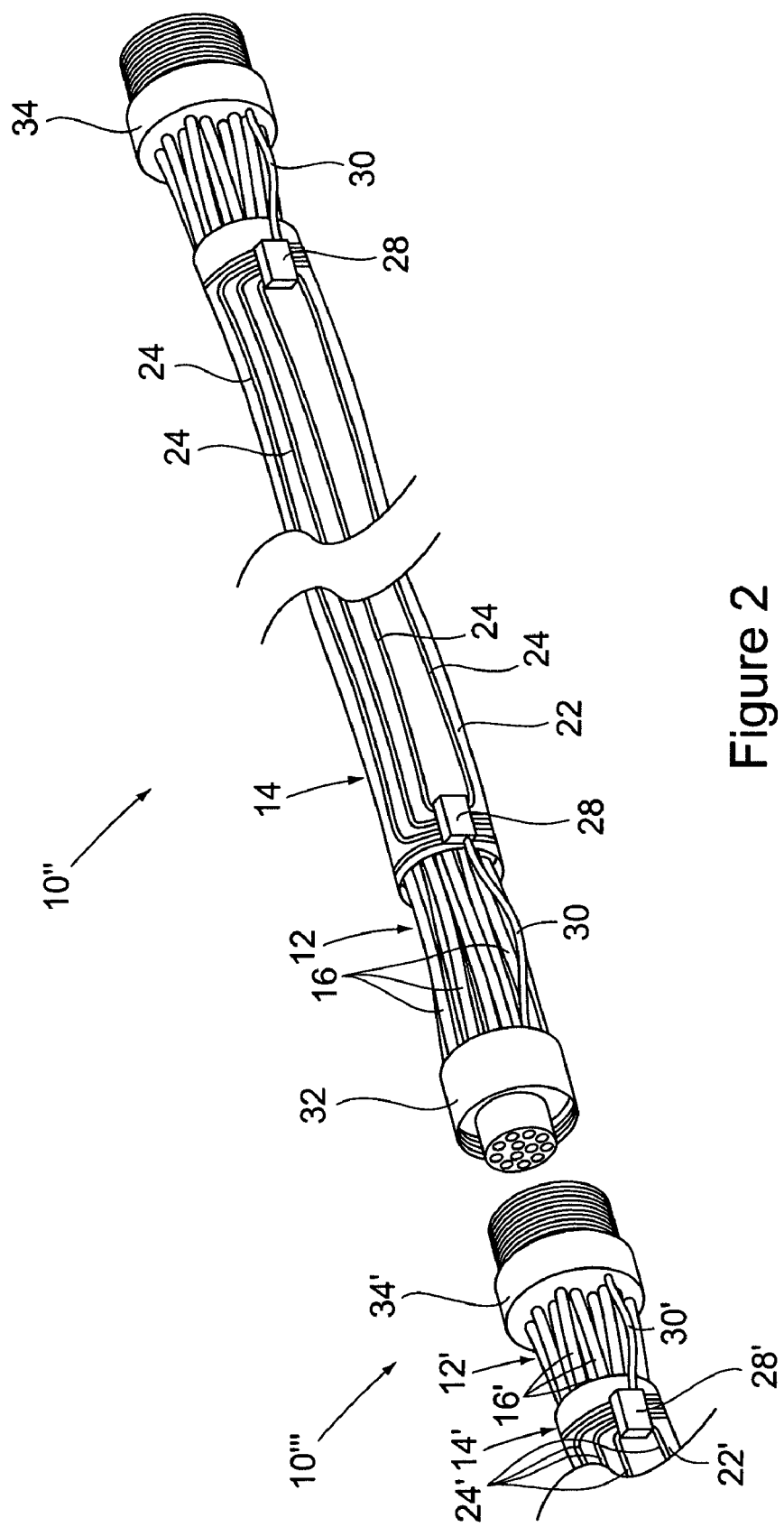
FIG. 2 is broken perspective view of a second preferred embodiment of an apparatus in accordance with the invention.

An alternative embodiment of a cable assembly 10",10'" is shown in FIG. 2. This embodiment is essentially identical to the cable assembly 10,10' described above, with the exception of the connection between the adjacent cables. In this embodiment, a combination electrical and optical connector 32,34 is provided at each end of a cable segment 10". These combination connectors connect both the electrical cables of adjacent cable segments 10",10'" and the intermediate waveguide portions 30",30'" of such cable segments. Thus, in this embodiment, separate optical waveguide connectors are not needed. However, it should be appreciate that while this can be advantageous from a assembly standpoint, it may also be less favorable in those cases where replacement of a sheath, but not the associated electrical cable, is desired.

While the present invention has been described in reference to specific embodiments, in light of the foregoing, it should be understood that all matter contained in the above description or shown in the accompanying drawings is intended to be interpreted as illustrative and not in a limiting sense and that various modifications and variations of the invention may be constructed without departing from the scope of the invention defined by the following claims. Thus, other possible variations and modifications should be appreciated.

Furthermore, it should be understood that when introducing elements of the present invention in the claims or in the above description of the preferred embodiment of the invention, the terms "comprising," "including," and "having" are intended to be open-ended and mean that there may be additional elements other than the listed elements. Similarly, the term "portion" should be construed as meaning some or all of the item or element that it qualifies.

What is claimed is:

1. An assembly comprising:
   an electrical cable, the electrical cable comprising at least one electrically conductive wire;
   a plurality of optical waveguides, the optical waveguides being disposed peripherally about the electrical cable in a manner to detect chafing of the electrical cable;
   first and second optical waveguide connectors; and
   first and second wavelength division multiplexing multiplexers/demultiplexers, the first wavelength division multiplexing multiplexer/demultiplexer operatively connecting each of the plurality of optical waveguides to the first optical waveguide connector, the second wavelength division multiplexing multiplexer/demultiplexer operatively connecting each of the plurality of optical waveguides to the second optical waveguide connector.

2. An assembly in accordance with claim 1 wherein the electrical cable extends longitudinally along a trajectory path and wherein each of the plurality of optical waveguides extends longitudinally along a trajectory path that is generally parallel to the trajectory path of the electrical cable.

3. An assembly in accordance with claim 2 wherein the trajectory paths of the plurality of optical waveguides are generally disposed peripherally about the electrical cable in an evenly spaced manner.

4. An assembly in accordance with claim 1 wherein each of the plurality of optical waveguides has opposite first and second longitudinal ends, the first longitudinal end of each of the plurality of optical waveguides terminating at the first wavelength division multiplexing multiplexer/demultiplexer, the second longitudinal end of each of the plurality of optical waveguides terminating at the second wavelength division multiplexing multiplexer/demultiplexer.

5. An assembly in accordance with claim 1 wherein the assembly further comprises a sheath that physically connects the plurality of optical waveguides to the electrical cable.

6. An assembly in accordance with claim 5 wherein the sheath encircles the electrical cable.

7. An assembly in accordance with claim 1 wherein each of the plurality of optical waveguides comprises a fiber optic ribbon.

8. An assembly comprising:
   an electrical cable, the electrical cable comprising at least one electrically conductive wire;
   a sheath, the sheath encircling the electrically conductive wire and comprising a plurality of optical waveguides, the optical waveguides being disposed peripherally about the electrical cable in a manner to detect chafing of the electrical cable;
   an optical waveguide connector; and
   a wavelength division multiplexing multiplexer/demultiplexer, the wavelength division multiplexing multiplexer/demultiplexer operatively connecting each of the plurality of optical waveguides to the optical waveguide connector.

9. An assembly in accordance with claim 8 wherein the optical waveguide connector constitutes a first optical waveguide connector and the wavelength division multiplexing multiplexer/demultiplexer constitutes a first wavelength division multiplexing multiplexer/demultiplexer, the assembly further comprising a second optical waveguide connector and a second wavelength division multiplexing multiplexer/demultiplexer, the second wavelength division multiplexing multiplexer/demultiplexer operatively connecting each of the plurality of optical waveguides to the second optical waveguide connector.

10. An assembly in accordance with claim 9 wherein each of the plurality of optical waveguides has opposite first and second longitudinal ends, the first longitudinal end of each of the plurality of optical waveguides terminating at the first wavelength division multiplexing multiplexer/demultiplexer, the second longitudinal end of each of the plurality of optical waveguides terminating at the second wavelength division multiplexing multiplexer/demultiplexer.

11. An assembly in accordance with claim 8 wherein the electrical cable extends longitudinally along a trajectory path and wherein each of the plurality of optical waveguides extends longitudinally along a trajectory path that is generally parallel to the trajectory path of the electrical cable.

12. An assembly in accordance with claim 11 wherein the trajectory paths of the plurality of optical waveguides are generally disposed peripherally about the electrical cable in an evenly spaced manner.

13. An assembly in accordance with claim 8 wherein each of the plurality of optical waveguides comprises a fiber optic ribbon.

14. A method comprising:
  providing first and second cables, each of the first and second cables comprising at least one electrically conductive wire and a plurality of optical waveguides;
  providing an intermediate optical waveguide;
  operatively connecting each of the plurality of optical waveguides of the first cable and each of the plurality of optical waveguides of the second cable to the intermediate waveguide;
  transmitting a plurality of separate wavelength channels of light along the plurality of optical waveguides of the first cable, the transmitting occurring in a manner such that each of the separate wavelength channels of light is transmitted along a separate one of the optical waveguides of the first cable;
  routing each of the separate wavelength channels of light transmitted along the plurality of optical waveguides of the first cable into the intermediate optical waveguide;
  routing each of the separate wavelength channels of light from the intermediate optical waveguide in a manner such that each of the separate wavelength channels of light is transmitted along a separate one of the optical waveguides of the second cable; and
  utilizing the above-recited steps to monitor the second cable for chafing damage.

15. A method in accordance with claim 14 wherein the method further comprises a step of providing first and second wavelength division multiplexing multiplexers/demultiplexers, and wherein the step of operatively connecting each of the plurality of optical waveguides of the first cable and each of the plurality of optical waveguides of the second cable to the intermediate waveguide comprises operatively connecting each of the plurality of optical waveguides of the first cable to the intermediate waveguide via the first wavelength division multiplexing multiplexer/demultiplexer and operatively connecting each of the plurality of optical waveguides of the second cable to the intermediate waveguide via the second wavelength division multiplexing multiplexer/demultiplexer, the step of routing each of the separate wavelength channels of light transmitted along the plurality of optical waveguides of the first cable into the intermediate optical waveguide occurring via the first wavelength division multiplexing multiplexer/demultiplexer and the step of routing each of the separate wavelength channels of light from the intermediate optical waveguide occurring via the second wavelength division multiplexing multiplexer/demultiplexer.

16. A method in accordance with claim 14 wherein the step of providing the intermediate optical waveguide occurs in a manner such that the intermediate optical waveguide comprises separate first and second portions and at least one optical waveguide connector, the method further comprising operatively connecting the first and second portions of the intermediate optical waveguide to each other via the optical waveguide connector, the method further comprising a step of transmitting the separate wavelength channels of light from the first portion of the intermediate optical waveguide to the second portion of the intermediate optical waveguide via the optical waveguide connector.

17. A method in accordance with claim 14 wherein the method further comprises a step of providing first and second electrical connectors, each of the first and second electrical connectors being removably attachable to the other of the first and second electrical connectors, the method further comprising a step of removably attaching the first electrical connector to the second electrical connector so as to create an electrical communication path between the electrically conductive wire of the first cable and the and the electrically conductive wire of the second cable.

18. A method in accordance with claim 14 wherein the step of providing the first and second cables occurs in a manner such that the electrically conductive wire of each of the first and second cables extends longitudinally along a trajectory path, and such that each of the plurality of optical waveguides of the first cable extends longitudinally along a trajectory path that is generally parallel to the trajectory path of the electrically conductive wire of the first cable, and each of the plurality of optical waveguides of the second cable extends longitudinally along a trajectory path that is generally parallel to the trajectory path of the electrically conductive wire of the second cable.

19. A method in accordance with claim 14 wherein the step of providing the first and second cables occurs in a manner such that each of the first and second cables comprises a sheath, the method further comprising a step of attaching the optical waveguides of each of the first and second cables to the sheath of the respective cable and encircling the at least one electrically conductive wire of the respective cable with the sheath of the respective cable in a manner disposing the optical waveguides of the respective cable peripherally about the at least one electrically conductive wire of the respective cable.

20. A method in accordance with claim 14 wherein the step of utilizing the recited steps to monitor the second cable for chafing damage comprises monitoring the second cable via an optical time domain reflectometer.

* * * * *